US008528199B2

(12) United States Patent
Chikyu

(10) Patent No.: US 8,528,199 B2
(45) Date of Patent: Sep. 10, 2013

(54) MANUFACTURING APPARATUS FOR WIRING HARNESSES AND A MANUFACTURING METHOD FOR WIRING HARNESSES

(75) Inventor: Hisaomi Chikyu, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 1278 days.

(21) Appl. No.: 12/003,588

(22) Filed: Dec. 28, 2007

(65) Prior Publication Data

US 2008/0113555 A1 May 15, 2008

(51) Int. Cl.
*H01R 9/00* (2006.01)
*H05K 3/00* (2006.01)

(52) U.S. Cl.
USPC .......... 29/842; 29/748

(58) Field of Classification Search
USPC .......... 29/748, 747, 749, 755, 757, 842; 439/595, 596
See application file for complete search history.

(56) References Cited

U.S. PATENT DOCUMENTS

| | | | | | |
|---|---|---|---|---|---|
| 4,380,118 | A | * | 4/1983 | Driver et al. | 29/747 |
| 4,383,361 | A | * | 5/1983 | Kautz | 29/739 |
| 4,635,355 | A | * | 1/1987 | Brinkman et al. | 29/747 |
| 4,867,705 | A | * | 9/1989 | Yuasa | 439/595 |
| 5,160,283 | A | * | 11/1992 | Fry et al. | 439/752 |
| 5,189,788 | A | * | 3/1993 | Sakai et al. | 29/842 |
| 5,829,914 | A | * | 11/1998 | Wells | 404/73 |
| 6,056,589 | A | * | 5/2000 | Endo et al. | 439/488 |
| 6,141,867 | A | * | 11/2000 | Fukada et al. | 29/747 |
| 6,148,505 | A | * | 11/2000 | Fujishima | 29/740 |
| 6,212,766 | B1 | * | 4/2001 | Ohsumi et al. | 29/755 |
| 6,390,846 | B2 | * | 5/2002 | Fukuda | 439/488 |
| 6,811,442 | B1 | * | 11/2004 | Lien et al. | 439/620.07 |
| 6,971,924 | B2 | * | 12/2005 | Fujita | 439/752 |
| 6,976,877 | B2 | * | 12/2005 | Lien | 439/620.01 |
| 6,986,684 | B1 | * | 1/2006 | Lien | 439/620.07 |
| 7,121,898 | B2 | * | 10/2006 | Murr et al. | 439/676 |
| 7,153,158 | B1 | * | 12/2006 | Lee | 439/541.5 |
| 7,314,387 | B1 | * | 1/2008 | Liu | 439/620.11 |
| 7,441,327 | B2 | * | 10/2008 | Furuya et al. | 29/748 |
| 2002/0174537 | A1 | * | 11/2002 | Chujo et al. | 29/747 |
| 2003/0077938 | A1 | * | 4/2003 | Yi-Tse | 439/572 |
| 2003/0219999 | A1 | * | 11/2003 | Minich et al. | 439/79 |
| 2004/0009711 | A1 | * | 1/2004 | Olejniczak et al. | 439/680 |
| 2005/0042901 | A1 | * | 2/2005 | Minich et al. | 439/79 |
| 2005/0136730 | A1 | * | 6/2005 | Olejniczak et al. | 439/417 |
| 2006/0063430 | A1 | * | 3/2006 | Furuya et al. | 439/595 |

FOREIGN PATENT DOCUMENTS

| | | | |
|---|---|---|---|
| JP | H10-112229 | | 4/1998 |
| JP | H10-112229 | * | 10/1998 |

* cited by examiner

*Primary Examiner* — David Angwin
(74) *Attorney, Agent, or Firm* — Edwards Wildman Palmer LLP

(57) ABSTRACT

For inserting terminals into each connector housing and reducing working area in processes by eliminating rearrangement of wires with terminals, a manufacturing method for wiring harnesses, including the steps of: picking up both ends of a wire at a predetermined position in a transferring direction from a transferring device by a pair of chucks, each chuck picking up one of the both ends of the wire; chucking the both ends of the wire with terminals fed through the pair of chucks, each end of the wire being fed through one of the pair of chucks, by a pair of terminal inserting heads as the terminal inserting device, the pair of terminal inserting heads moving freely independently of each other at least in a direction of a row of a connector housings; and inserting the terminals at the both ends simultaneously into each of the connector housings.

2 Claims, 6 Drawing Sheets

MANUFACTURING APPARATUS FOR WIRING HARNESSES AND A MANUFACTURING METHOD FOR WIRING HARNESSES

BACKGROUND OF THE INVENTION

1. Field of the Invention

This invention relates to a manufacturing apparatus for wiring harnesses and a manufacturing method for wiring harnesses to form a wiring harness or a wiring sub-harness by inserting a terminal of a wire with terminals picked up from a holder of a transferring device into a connector housing in a terminal insertion process as a last process.

2. Description of the Related Art

FIG. 6 shows a manufacturing apparatus for wiring harnesses in the prior art and one step of a manufacturing method for wiring harnesses in the prior art, for example, disclosed in Patent document of Japan Published Patent Application No. H10-112229.

The wiring harness includes a plurality of electric wires, terminals joined to each of both ends of the wire, and a connector receiving the terminals. The wire is measured and cut in a predetermined length by a cutting device (not shown) and an insulation cover is stripped at the both ends thereof by a wire stripping machine (not shown), and the terminals are crimped to respective exposed cores by a terminal crimping machine (not shown). When using pressure-contact type terminals, the terminals are joined by pressure contact to the wire by a pressure contact machine (not shown) without stripping the cover.

Cutting the wire and stripping the cover of the wire and joining terminals 6 are performed successively in automated processes. The wire cut in the predetermined length is folded into a U-shape and the both ends of the wire are held at each holder (not shown) on an endless belt and fed to a removing process and thereafter to a terminal joining process. The holder has a pair of holding claws pushed to be closed by a spring. The both ends of the wire are held at the adjacent holders. The plurality of wires is held in serial order of cutting by each holder and the cover thereof is stripped and the each wire is crimped to the terminals 6 to be a wire with terminals 4.

The each wire with terminals 4, as shown in FIG. 6, is chucked and picked up from the holder on the endless belt and placed at a temporal holder 42 of a wire holder bar 41 in order of insertion to a connector housing 14 by a pair of right-and-left wire chucks (not shown). Generally, both ends 5 of the wire with terminals 4 are arranged at the temporal holders 42 unadjacent and apart from each other. The wire holder bar 41 includes a bar member 43 made of aluminium and the temporal holders 42 made of synthetic resin, which are fixed with even intervals on the bar member 43.

The wires with terminals 4 on the wire holder bar 41 in order from the left end one in FIG. 6 are chucked and picked up and inserted into each terminal receiving section 26 of the connector housing 14 made of an insulating resin by a pair of terminal inserting chucks 44, 44'. A connector is structured with the connector housing 14 and terminals 6 of the wire with terminals 4.

The connector housing 14 shows in FIG. 7 has a plurality of terminal receiving sections 26 (6 sections) juxtapositionaly in each of upper and lower rows. When it is intended that the terminals 6 are inserted in order of from a first to a fourth sections in FIG. 7, the terminal 6 in the lower row to be inserted fourth in order interferes with the wire with terminals 4, the terminal 6 of which was inserted second in order in the upper row, and thereby cannot be inserted. To solve the problem, for example, the terminals 6 can be inserted in order of the first section (lower row), the fourth section (lower row), a third section row) and a second section (upper row) by rearranging the terminals 6 of the wires with terminals 4 instead of the previous order. The terminals 6 at left and right sides of the terminal 6 at the second section (upper row) can be inserted last. Instead, after the terminals 6 are inserted into all sections in the lower row, the terminals 6 can be inserted into the section in the upper row in order from the left end section in FIG. 7.

When the connector housing 14 has the terminal receiving sections 26 only in one row, the terminals 6 can be inserted efficiently into the connector housing 14 by rearranging the terminals 6 so as to be inserted in order from the left end terminal receiving section 26 or from the right end terminal receiving section 26.

SUMMARY OF THE INVENTION

Objects to be Solved

According to the manufacturing apparatus for wiring harness and the manufacturing method for wiring harness by prior art, the wire holder bar 41 for chucking the rearranged wires with terminals 4 and/or a cart for storing the wire holder bars 41 (not shown) are required, so that enlargement of processing areas and cost increase for the wire holder bars 41 and the cart become problems. In addition, the wires are placed to intersect to each other at the wire chuck bar, so that it would be possible that the wires are easily entangled each other and the entangled wires fall out of the temporal holder 42.

When one of the pair of terminal inserting chucks 44' moves to pick up the wire with terminals 4 from the wire holder bar 41, the other of the pair of terminal inserting chucks 44 inserts the terminal 6 into the connector housing 14 so as to prevent interference of the both terminal inserting chucks 44, 44' at the wire chuck bar. Therefore, the terminal 6 is inserted only by one terminal inserting chuck and terminal insertion requires much time.

According to the above problems caused by rearrangement of wires with terminals, an object of the present invention is to provide a manufacturing apparatus for wiring harnesses and a manufacturing method for wiring harnesses, which can inserts efficiently terminals into a connector housing without rearrangement of the wires and can minimize processing areas.

How to Attain the Object of the Present Invention

In order to attain the object of the present invention, a manufacturing apparatus for wiring harnesses is characterized in that the manufacturing apparatus, which has a cutting device measuring and cutting a wire in a predetermined length, a terminal joining device joining a terminal to each of both ends of the cut wire, a transferring device transferring the wire with terminals at the both ends thereof, and a terminal inserting device inserting the terminal into each connector housing supported at a connector receiving jig, includes a pair of chucks picking up the both ends of the wire with terminals from the transferring device at a predetermined position, and a pair of terminal inserting heads, as the terminal inserting device, moving freely independently of each other at least in a direction of a row of the connector housings, and chucking the both ends of the wire with terminals fed through the pair of chucks and inserting the terminals at the both ends simultaneously into each of the connector housings.

The manufacturing apparatus for wiring harnesses is further characterized by further including a pair of feeding chucks receiving the both ends of the wire with terminals through the pair of chucks, and feeding the wire with terminals to the terminal inserting head.

The manufacturing apparatus for wiring harnesses is further characterized by further including a pair of temporarily holding units holding the both ends of the wire with terminals from the pair of chucks so as to pick up the wire with terminals by the pair of feeding chucks.

The manufacturing apparatus for wiring harnesses is further characterized in that the terminal is inserted into the connector housings in a condition of turning the connector housings set in the connector receiving jig upside down and turning the terminal upside down.

A manufacturing method for wire harnesses by inserting a terminal into each connector housing supported at a connector receiving jig by using a terminal inserting device is characterized in that the method includes the steps of: measuring and cutting a wire in a predetermined length; joining a terminal to each of both ends of the cut wire; transferring the wire with terminals by a transferring device; picking up the both ends of the wire with terminals from the transferring device at a predetermined position by a pair of chucks; chucking the both ends of the wire with terminals fed through the pair of chucks by a pair of terminal inserting heads as the terminal inserting device, which move freely independently of each other at least in a direction of a row of the connector housings; and inserting the terminals at the both ends simultaneously into each of the connector housings.

The manufacturing method for wire harnesses claimed in claim 6 is characterized on the manufacturing method for wire harnesses in claim 5 by further including the steps of turning the connector housing supported at the connector receiving jig upside down, turning the terminal upside down, and inserting the terminal into connector housing.

Effects of Invention

According to the present invention mentioned above, the pair of terminal inserting heads inserts the terminals into the each connector housing in order of transferring the wires with terminals by the transferring device. Thereby, rearrangement of the wires in an apparatus by prior art is eliminated, and wire chuck bars and a cart for storing the wire chuck bars in the apparatus by prior art are not required, so that processing areas can be minimized and processing cost can be reduced. Since the wire with terminals is fed to the terminal inserting head without the wire chuck bar, transference of the wire with terminals and insertion of terminal can be performed efficiently and productivity of the wiring harness is improved. A trouble of entangling the wires when using the wire chuck bar by prior art is eliminated and insertion of the terminals is performed smoothly and securely. Since terminals at the both ends of the wire are simultaneously into the each connector housing, insertion of the terminal can be performed efficiently and rapidly.

According to the present invention, the wire with terminals can be transferred smoothly and rapidly for inserting the terminals when a distance between the transferring device and the terminal inserting head is long.

According to the present invention, the wire with terminals can be transferred securely without positioning error by applying a path through the temporarily holding unit from the pair of feeding chucks to the pair of chucking units. Thereby, even if a distance between the transferring device and the terminal inserting head is long, the wire with terminals can be transferred more smoothly and securely, and the terminal can be inserted more securely.

According to the present invention, since the connector housing and the terminals are turned upside down, the terminals at the lower row can be inserted smoothly and securely without interference with the terminals at the upper row in a normal position. Since the terminals at the lower row are inserted in opposite order to that at the upper row, rearrangement of the terminals as the prior art can be eliminated, and the wire chuck bars as the prior art are not required and the above effect by the present invention is enhanced.

The above and other objects and features of this invention will become more apparent from the following description taken in conjunction with the accompanying drawings.

DESCRIPTION OF THE PREFERRED EMBODIMENT

Figure 1:
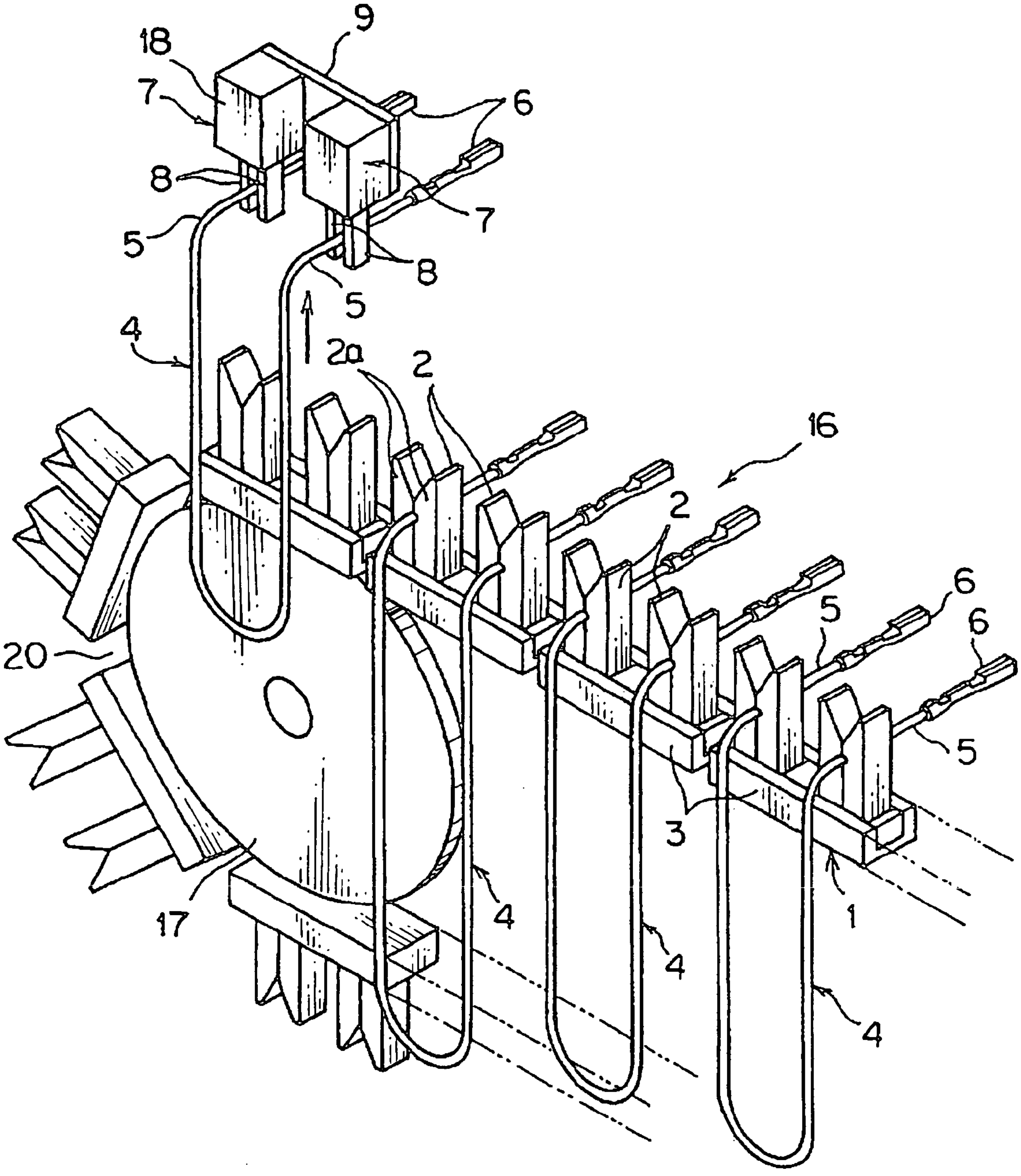
FIG. 1 is a perspective view of a conveyer belt and chucks of a manufacturing apparatus for wiring harnesses according to the present invention.

FIGS. 1-4 show one embodiment of a manufacturing apparatus for wiring harnesses and a manufacturing method for wiring harnesses according to the present invention.

The manufacturing apparatus for wiring harnesses includes a plurality of holders 2 of a transferring device 16, a pair of right-and-left chucks 7 arranged at right and left sides in a horizontal direction and picking up one wire with terminals 4 held in two holders 2 adjacent to each other, a pair of right-and-left temporarily holding units 10 receiving both ends of the wire with terminals 4 from the pair of chucks 7, a pair of right-and-left feeding chucks 12 chucking and picking up the both ends 5 of the wire with terminals 4, chucking units 13 of a pair of right-and-left terminal inserting heads 30 receiving both ends 5 of the wire with terminals 4 from the pair of feeding chucks 12, and a connector supporting jig 15 supporting the connectors to be inserted terminals 6 of the wire with terminals 4 chucked by the chucking units 13.

As shown in FIG. 1, a conveyer belt 1 is formed by connecting a plurality of oblong plate-shape base trays 3 so as to be flexible, on which each two holders 2 are arranged and fixed at the each base tray 3. The transferring device 16 includes the conveyer belt 1, holders 2, a rotating disk 17 such as a gear, and a driving unit (not shown) such as a drive motor. The holder 2 has a pair of holding claws 2*a* pushed to be closed by a spring (not shown), similarly as that by prior art. The conveyer belt 1 is rotated in a counterclockwise direction in FIG. 1 by rotating disks 17 at right and left ends and the driving unit. Instead of the conveyer belt 1, an endless belt, such as a timing belt, can be used.

Similarly as that of the prior art, a wire wound on a reel without a terminal is measured and cut in a predetermined length by a cutting device. Thereafter, the wire is formed into a u-shape and both ends 5 of the wire are held at the holders 2 of the conveyer belt 1. Then, each insulation cover at the both ends 5 of the wire is stripped by a wire stripper, and the terminals 6 each are crimped together with each exposed core at the both ends by a crimping machine (a terminal joining device). In case of pressure contact, not stripping the insulation cover of the wire, the terminals 6 are joined with the both ends 5 of the wire by a pressure contact machine (the terminal joining device). Thereby, the wire with terminals 4 is manufactured. The wire can be held at the holders 2 after stripping the insulation cover.

The each both ends 5 of the plurality of wires with terminals 4 are held at the two holders 2 adjacent each other, and the two holders 2 holding the wires with terminals 4 is transferred underneath the chucks 7. A pick-up position, in which the wire with terminals 4 is picked up by the chuck 7, is defined at one location. As shown in FIG. 1, the pick-up position is preferably in the vicinity of an area at an end in a transferring direction.

The pair of right-and-left chucks 7 is fixed on a vertical base plate 9 (FIG. 1). The base plate 9 can move freely together with the pair of chucks 7 in vertical and horizontal directions by a vertical motion device and a horizontal motion device. A vertical air cylinder or a ball screw system having a ball screw shaft, a nut engaged with the shaft and a drive motor rotating the shaft, can be applied for the vertical motion device. A horizontal slide system having a horizontal rail and a horizontal air cylinder moving the base plate along the rail or the ball screw system can be applied for the horizontal motion device. The vertical motion device is mounted on the horizontal motion device so as to move together with the chucks 7 and base plate 9 in the horizontal direction.

The chuck 7 includes a pair of right-and-left chuck arms 8 (FIG. 1) and an open-close actuator 18 actuating the pair of chuck arms 8 to open and close. The pair of chuck arms 8 project downwardly from the open-close actuator 18. A distance between the centers of chuck arms of the pair of chucks 7 is made equal to a distance between the two holders 2, on the conveyer belt 1, holding the wire with terminals 4. The pair of chuck arms 8 preferably has a groove along the horizontal direction for holding the wire with terminals 4 securely without displacement.

A holder opening unit (not shown) structured with a vertically movable blade and a vertical air cylinder actuating the blade can be applied at the chuck 7 or base plate 9 for opening forcibly the temporarily holding unit 10 when the wire with terminals 4 is held into the temporarily holding unit 10. A unit similar as this holder opening unit is described in FIG. 18 of the Patent document of Japan Published Patent Application No. H10-112229.

When the holder opening unit is not applied, the pair of right-and-left chuck arms 8 can be divided to a pair of front and rear arm members (not shown) so as to move the temporarily holding unit 10 between the pair of front and rear arm members. Thereby, the pair of chuck arms 8 can chuck the wire with terminals 4 at front and rear sides of the temporarily holding unit 10, so that displacement and/or slant holding of the ends 5 of the wire can be prevented. Similarly, when the wire with terminals 4 is picked up from the holder 2 on the conveyer belt 1, the pair of chuck arms 8 can chuck the wire with terminals 4 at front and rear sides of the holder 2.

Figure 2:
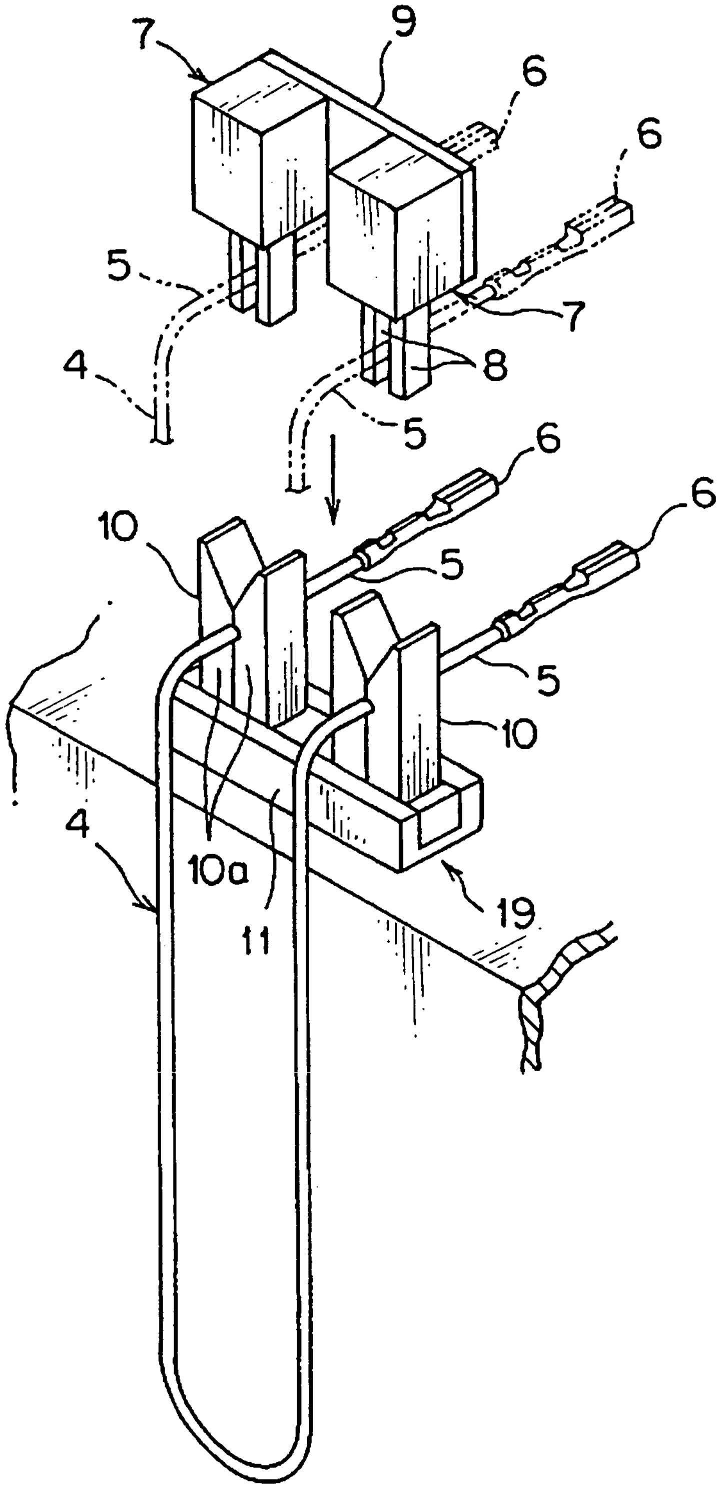
FIG. 2 is a perspective view of the chucks placing a wire with terminals at temporarily holding units of the manufacturing apparatus for wiring harnesses according to the present invention.

As shown in FIG. 2, the pair of right-and-left temporarily holding units 10 is arranged in a line on a horizontal base plate 11. A wire temporarily holding device 19 is structured with the pair of temporarily holding units 10 and the base plate 11. The base plate 11 is fixed on a horizontal base frame (not shown) of the manufacturing apparatus for wiring harnesses. The pair of temporarily holding units 10 is arranged adjacently to a left end area 20 of the conveyer belt 1. The pair of chucks 7 moves horizontally in a direction of transferring the wire with terminals 4 (toward the left side) from a position shown in FIG. 1 to a position shown in FIG. 2.

The temporarily holding unit 10 similarly as the holder 2 on the conveyer belt 1 has a pair of right-and-left holding claws 10*a* and a spring (not shown) pushing the holding claws 10*a* to be closed. The spring can be formed integrally with the holding claw 10*a* by resin molding, or can be formed separately from the holding claw 10*a* by metal. The temporarily holding unit 10 also can eliminate the spring so as to hold the wire with terminals 4 by using an elastic restoring force of the holding claws 10*a*. These structures can be applied for the holder 2 on the conveyer belt 1.

A distance between the pair of temporarily holding units 10 is made equal to a distance between the centers of the pairs of chuck arms 8 of the pair of chucks 7. Therefore, the distance between the holders 2 adjacent to each other on the conveyer belt 1, the distance between the centers of the pairs of chuck arms 8 of the pair of chucks 7 and the distance between the temporarily holding units 10 are equal to each other.

The wire with terminals 4 is formed into a U-shape and the both ends 5 thereof is held at the two holders 2 adjacent to each other. The wire with terminals 4 is transferred to a position underneath the chuck 7. The pair of chucks 7 moves down by the vertical motion device, and picks up and moves up the both ends 5 of the wire with terminals 4. The pair of chucks 7 moves to a position over the temporarily hold units 10 by the horizontal motion device and moves down by the vertical motion device, and feeds the both ends 5 of the wire with terminals 4 to the temporarily hold units 10. Feeding the both ends 5 is performed by pushing the both ends 5 into the temporarily hold units 10 against a pushing force of the spring. Instead thereof, firstly the blade of the holder opening unit is pushed into the temporarily holding unit 10 so as to open the temporarily holding unit 10, and secondarily each of the both ends 5 is placed in each temporarily hold units 10, and the blade is pulled up.

Figure 3:
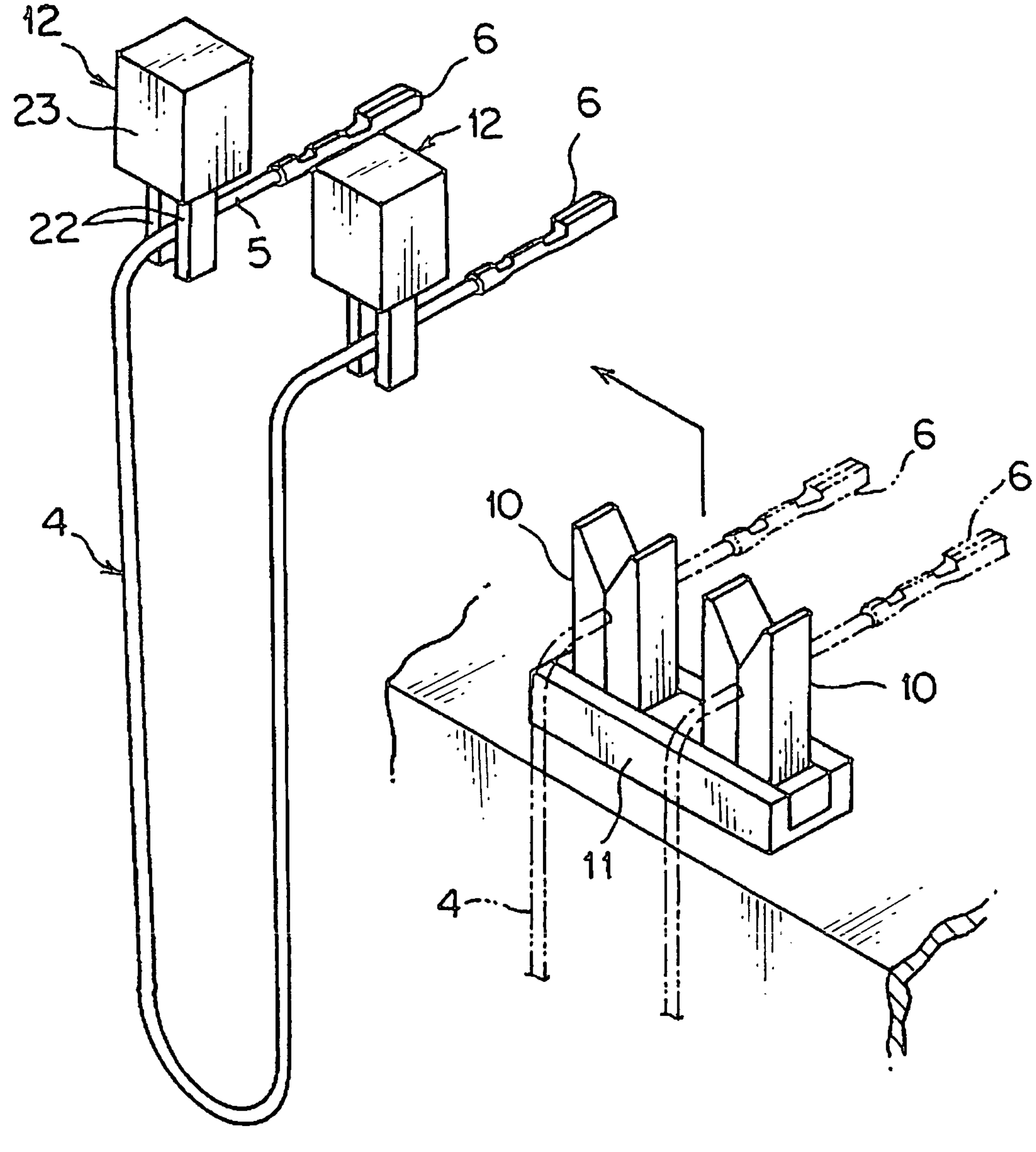
FIG. 3 is a perspective view of feeding chucks picking the wire with terminals from the temporarily holding units shown in FIG. 2.

As shown in FIG. 3, the both ends 5 of the wire with terminals 4 held temporarily at the temporarily holding unit 10 are chucked and picked up by the pair of feeding chucks 12, and the wire with terminals 4 is fed to a terminal inserting station 21. The terminal inserting station 21 is located along the direction of transferring the wire by the conveyer belt 1 in FIG. 1. Between the conveyer belt 1 and the terminal inserting station 21, the temporarily holding unit 10 is arranged.

The pair of feeding chucks 12 in this embodiment can move vertically as one body and can move horizontally independently of each other. The pair of feeding chucks 12 is mounted slidably on a horizontal guide rail so as to move horizontally by the horizontal motion device, such as a horizontal ball screw or an air cylinder. The guide rail is mounted on a vertical oblong base plate (not shown). The vertical base plate can move vertically by the vertical motion device, such as a vertical air cylinder or a ball screw.

Each of the pair of feeding chucks 12 is connected respectively with each of the vertical motion devices fixed on respective blocks. By engaging slidably the each block fixing the vertical motion device with the horizontal guide rail, the blocks can move independently of each other in the horizontal direction by the horizontal motion devices. The horizontal motion and vertical motion devices can be structured with other actuator or motion unit.

Each feeding chuck 12, similarly as the chuck 7, is structured with a pair of right-and-left chuck arms 22 and an open-close actuator 23 actuating the pair of chuck arms 22 to open and close. The chuck arms 22 project downwardly from the open-close actuator 23. The pair of chuck arms 22 preferably has a groove along the horizontal direction for holding the wire with terminals 4 securely without displacement.

A holder opening unit (not shown) structured with a vertically movable blade and a vertical air cylinder actuating the blade, similarly as the chuck 7, can be applied at the each feeding chuck 12 for opening forcibly the temporarily holding unit 10.

When the holder opening unit is not applied, one of the pair of right-and-left chuck arms 22 can be divided to a pair of front and rear arm members so as to move the temporarily holding unit 10 between the pair of front and rear arm members. Thereby, the chuck arms 22 can chuck the wire with terminals 4 at front and rear sides of the temporarily holding unit 10, so that displacement and/or slant holding of the ends 5 of the wire can be prevented.

Figure 4:
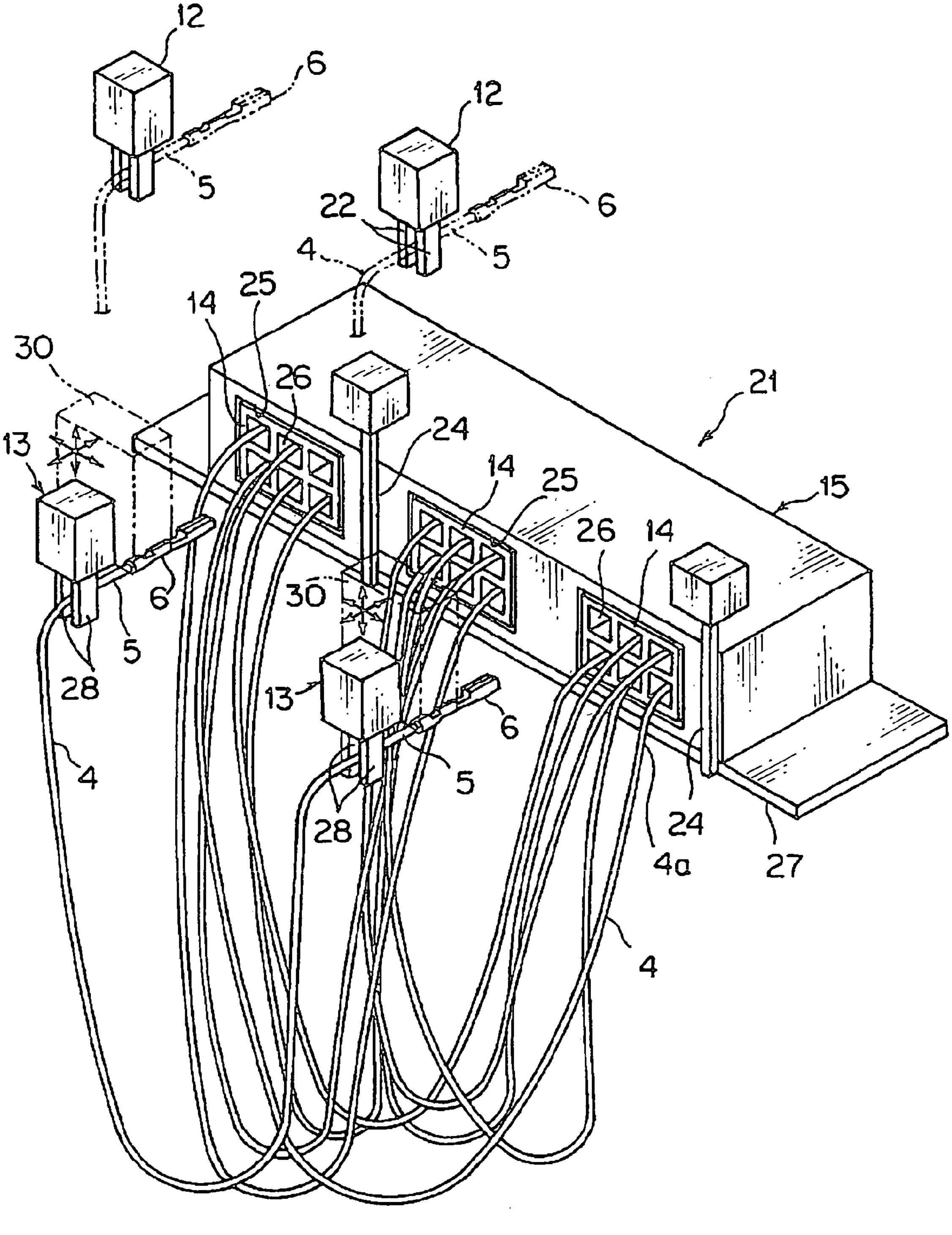
FIG. 4 is a perspective view of terminal inserting heads receiving the wire with terminals from the feeding chucks and inserting the terminals into connector housings of the manufacturing apparatus for wiring harnesses according to the present invention.

As shown in FIG. 4, the connector supporting jig 15 is arranged along the direction of transferring the wire by the conveyer belt 1 in FIG. 1. The pair of right-and-left terminal inserting heads 30 is provided front ward (at a front side) from the connector supporting jig 15. A terminal inserting guide 24 is arranged in the vicinity of a front side (front end surface having insertion openings of the terminal receiving sections 26) of the connector housing 14 mounted in the connector supporting jig 15.

The connector supporting jig 15 in this embodiment has parallel rows each having a plurality of rectangular sections 25 to mount the connector housing 14 with even intervals in the horizontal direction. Thereby, a plurality of connector housings 14 can be mounted at one process. The connector housing 14 is fixed in each section 25 by a lock unit (not shown) of the connector supporting jig 15.

The lock unit locking the front end surface of the connector housing 14 by an elastic hook or a rotating hook can be used. Instead of the section 25, recesses can be provided on a top surface of the connector supporting jig 15. The connector housing 14 is inputted in the groove and held by a chuck with a spring from a top thereof.

When the wiring harness has a wire with a different-shape terminal or a wire with a stripped end, the wire with the different-shape terminal or the wire with the stripped end can be hanged and temporarily held on a horizontal base plate 27 under the connector supporting jig 15. The wire with the different-shape terminal can be also transferred from the conveyer belt 1 by the feeding chuck 12. The different-shape terminal of the wire with the different-shape terminal, however, is preferably inserted manually. The stripped end of the wire with the stripped end is, for example, joined with a stripped portion (an exposed core portion of the wire with terminals) at a middle area in a lengthwise of the wire with terminals 4, the terminals of which are inserted into the connector housings 14. The wires joined with each other have a number of terminals, which is sum of two of the both ends and a number of an added terminal. The added terminal of the joined wire can be inserted by a pair of chuck arms 28 of one of the chucking units 13, and also manually by an operator.

For a purpose of turning the connector housing 14 upside down as shown in FIG. 5, the section 25 or the groove corresponding a shape of turning the connector housing 14 upside down is provided at the connector supporting jig 15. Instead of that, it can be designed that a connector holder including the section or the groove of the connector supporting jig 15 is rotatable 180 degrees upside down. The connector holder may be rotated manually by the operator or automatically by a motor. The connector holder rotated 180 degrees is fixed on the connector supporting jig 15 by a locking device. As the locking device, an elastic claw or a ball plunger pushed by a spring can be applied.

When the connector housing 14 is turned upside down, the terminals 6 must be turned. For example, chucking the end 5 of the wire with terminals 4 by the pair of chuck arms 8, 28 of the chuck 7 or the chuck units 13, and sliding the pair of cramp arms 8, 28 to each other in a vertical direction (lengthwise direction of the chuck arms) at a distance corresponding to a diameter of the wire (a circumference of the wire), the end 5 can be rotated in a circumferential direction of the wire. In this case, by sliding the pair of the chuck arms 8, 28 simultaneously in directions opposite to each other at the same distance, a height of the end 5 is not changed. When it is allowed that the height of the end 5 is changed, one of the pair of chuck arms 8, 28 can be slid and the other can be fixed. Temporarily feeding the rotated end 5 from the pair of chuck arms 28 to the temporarily holding unit 10, then, the end 5 can be chucked again by the pair of chuck arm 28 to insert into the connector housing 14. Generally, the rotated end 5 upside down may be fed from the chuck 7 to the temporarily holding unit 10.

As the pair of chuck arms 28 of the chuck units 13 at the pair of terminal insertion heads 30, usual one having a terminal chuck at front side and a wire chuck at rear side can be applied. The terminal chuck and the wire chuck can move in vertical and horizontal directions independently to each other.

Usually, the terminal chuck chucks the terminal 6 and the wire chuck chucks the wire at a position near the terminal 6. Thereafter, the pair of chuck arms 28 initially inserts the terminal 6 into the terminal receiving section 26 of the connector housing 14 and the terminal chuck moves and escapes upwardly. Then, the wire chuck completely inserts the terminal 6 in the terminal receiving section 26. The terminal 6 can be inserted only by the wire chuck without the terminal chuck, but it is possible that the terminal 6 is moved or hooked so as to be inserted inefficiently.

The terminal inserting guide 24 is made of sheet material to form a path for inserting terminal 6 by pushing and splitting the wires **4*a* led from the connector housing 14. The terminal inserting guide 24 is preferably provided for each connector housing 14**.

In this embodiment, the chucking units 13 of the pair of right-and-left terminal inserting heads 30 can move in the right-and-left horizontal directions independently of each other and move in the vertical and front-and-rear horizontal directions (direction of inserting terminals) integrally with each other. Actuator for moving the terminal inserting head 30 includes a vertical actuator such as a vertical air cylinder and a horizontal actuator such as a front-and-rear horizontal air cylinder mounted integrally on the vertical actuator. The chucking unit 13 is arranged at the horizontal actuator as a usual one. The terminal inserting head 30 is structured with the respective actuators and the chucking unit 13.

The pair of right-and-left terminal inserting heads 30 can move freely in the right-and-left directions along a horizontal guide rail independently of each other. The pair of terminal inserting heads 30 is engaged slidably with the guide rail and moved in the right-and-left directions by an actuator having a ball screw, a nut member and a motor. The each pair of chuck arms 28 can move in 3 directions of X, Y and Z shown with arrows in FIG. 4.

As shown in FIG. 4, the both ends 5 of the wire with terminals 4 chucked by the pair of feeding chucks 12 are chucked by the chucking units 13 of the pair of terminal inserting heads 30. Then, by opening the both feeding chucks 12, the wire with terminals 4 is fed from the feeding chucks 12 to the both chucking units 13. The both chucking units 13 move upwardly or move upwardly and forwardly together to approach the feeding chucks 12 and receive the both ends 5 of the wire with terminals 4 from the feeding chucks 12. The both chucking units 13 are preferably separated to each other in a distance equal to that between the connector housings 14, into which the both terminals 6 are inserted each. The pair of feeding chucks 12 is preferably separated to each other in the same distance as that between the pair of chucking units 13.

Next, the both chucking units 13 move downwardly and forwardly to the each connector housing 14 in the connector supporting jig 15 so as to insert the terminals 6 at the both ends 5 of the wire with terminals 4 simultaneously into the each connector housing 14. The terminal 6 at one end 5 is inserted into one of the connector housings 14, and the terminal 6 at the other end 5 is inserted into the other of connector housings 14. Since the terminals 6 at the both ends 5 are inserted simultaneously into the each connector housing 14, an operating time is shortened. The connector housings 14 may be the same type, also the different type.

A tact time required to insert the terminal 6 (terminal insertion tact), a tact time in which the feeding chucks 12 feed the wire with terminals from the temporarily holding units 10 to the terminal inserting heads 30, a tact time in which the chucks 7 feed the wire with terminals 4 from the conveyer belt 1 to the temporarily holding units 10, and a tact time required to cut the wire and strip the wire and crimp the terminals all are preferably adjusted in the same value.

When the terminals 6 at the both ends 5 are inserted into the same connector housing 14, each terminal 6 is inserted preferably in sequence by the same chucking unit 13 for preventing interference between the pair of chucking units 13.

Immediately after the terminal 6 is inserted by the chucking unit 13, by pulling the wire with terminal 4 backwardly by the chucking unit 13, it is confirmed whether or not the terminal 6 is securely locked by a locking lance in the connector housing 14. The terminals 6 at the both ends of the plural wires with terminals 4 are inserted in the plural connectors 14 arranged in parallel to each other, thereby each wire **4*a* formed into a U-shape is led from the each connector housing 14. By removing the each connector 14 with this shape from the connector supporting jig 15, a wiring harness or a wiring sub-harness having a similar shape in use is assembled. The connector is formed with the connector housing 14 and the terminals 6** made of a conductive metal.

According to the manufacturing apparatus for wiring harnesses and the manufacturing method for wiring harnesses shown in FIGS. 1-4, the both ends 5 of the wire with terminals 4 are picked up from the two holders 2 near to the end area 20 of the conveyer belt 1 by the chuck 7 and held temporarily at the pair of temporarily holding units 10; and the both ends 5 of the wire with terminals 4 are chucked and picked up from the pair of temporarily holding units 10 and fed to the pair of terminal inserting heads 30 by the pair of feeding chucks 12; and the terminals 6 at the both ends 5 of the wire with terminals 4 are inserted simultaneously into each connector housing 14. Thereby, the terminals 6 of the wires with terminals 4 transferred by the conveyer belt 1 can be inserted in order, and rearrangement of the terminals 6 is eliminated. The wire holding bar and a cart for storing the wire holder bars are not required, so that processing areas and cost for the wire holder bars and the cart are reduced. In addition, it would be not afraid that the wires are easily entangled each other by rearrangement of terminals at the wire holding bars and the wires with terminals 4 can be fed to the terminal inserting heads 30 smoothly and securely.

Figure 5A:
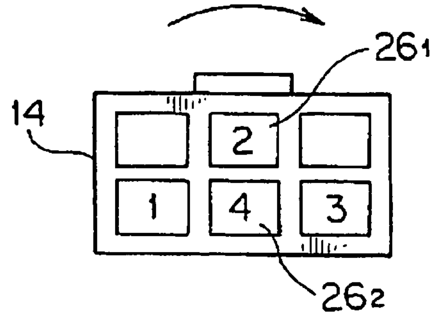
FIG. 5A is a front view of the connector housing in an original position.
Figure 5B:
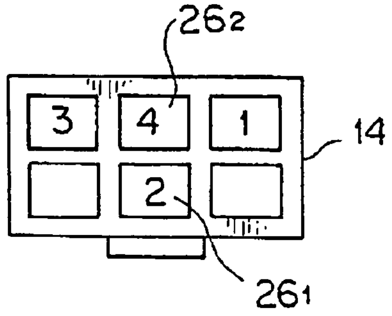
FIG. 5B is a front view of the connector housing turned upside down.
Figure 6:
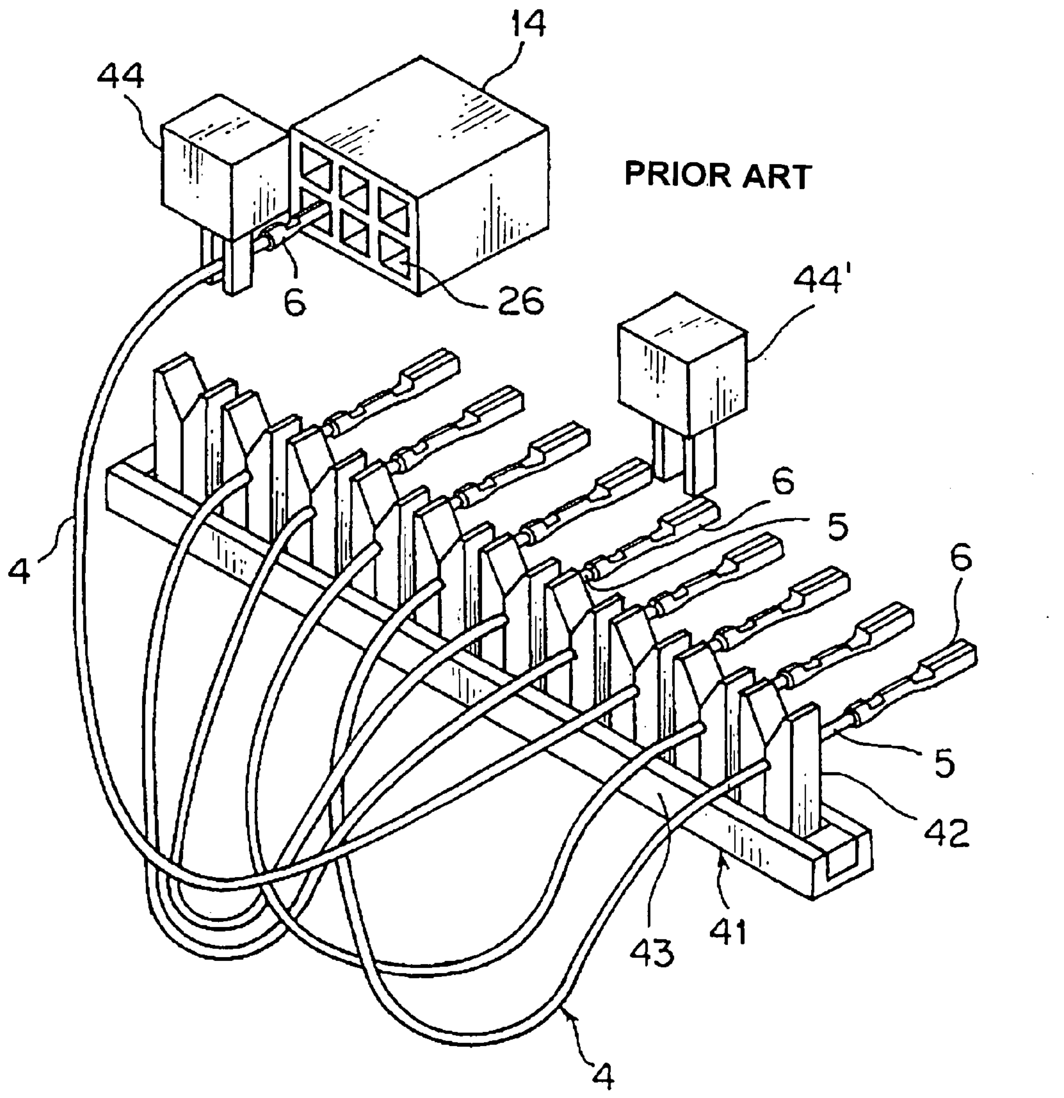
FIG. 6 is a perspective view of a chuck picking up a wire with terminals held at a wire holding bar and inserting a terminal into a connector housing of a manufacturing apparatus for wiring harnesses by prior art.
Figure 7:
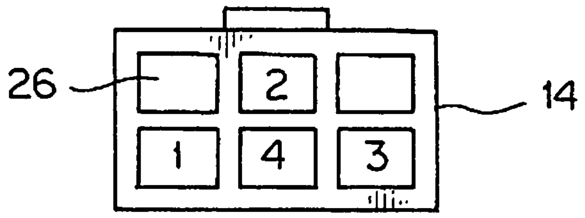
PRIOR ART FIG. 7
FIG. 7 is a front view of the connector housing, showing insertion order of the terminal according to a manufacturing method by prior art.

After the terminal 6 is inserted into the terminal receiving section $\mathbf{26}_1$ in the upper row of the connector housing 14, it I difficult to insert the terminals 6 into the terminal receiving sections $\mathbf{26}_2$ in the lower row by interference with the wire **4*a* led from the upper row, as shown in FIG. 5*a*. To overcome the problem, the connector housing 14 shown in FIG. 5*a* is turned upside down as shown in FIG. 5*b* to be held in the connector supporting jig 15 (FIG. 4**).

As mentioned above, when the connector housing 14 is turned upside down, the terminals 6 must be turned upside down. For example, chucking the end 5 of the wire with terminals 4 by the pair of chuck arms 8, 28 of the chuck 7 or the chuck units 13, and sliding the pair of cramp arms 8, 28 to each other in the vertical direction (lengthwise direction of the chuck arms) at the distance corresponding to a diameter of the wire (the circumference of the wire), the end 5 can be rotated in the circumferential direction of the wire. In this case, by sliding the pair of the chuck arms 8, 28 simultaneously in directions opposite to each other at the same distance, the height of the end 5 is not changed. When it is allowed that the height of the end 5 is changed, one of the pair of chuck arms 8, 28 can be slid and the other can be fixed. Temporarily feeding the rotated end 5 from the pair of chuck arms 28 to the temporarily holding unit 10, then, the end 5 can be chucked again by the pair of chuck arms 28 to insert into the connector housing 14. Generally, the rotated end 5 upside down may be fed from the chuck 7 to the temporarily holding unit 10.

When the terminals 6 are inserted into the terminal receiving sections 26 in order of the numbers shown in FIG. **5*a*, the fourth terminal 6 of the wire interferes with the led wire 4*a* of the second wire with terminals 4. Then, turning the connector housing 14 shown in FIG. 5*a* upside down so as to be shown in FIG. 5*b*, the terminals 6 are inserted into the terminal receiving sections 26 in order of the numbers 1-4. After completing insertion of the terminals, turning the connector housing 14 back to an original position, the wiring harnesses or sub-harnesses shown in FIG. 4** is manufactured easily.

Instead of turning upside down, to insert the terminals 6 into the connector housing 14 having terminal receiving sections in multiple rows, the usual terminal inserting guide 24 having a pair of right-and-left split claws can be applied. After inserting the terminals 6 into the terminal receiving sections $\mathbf{26}_1$ in the upper row, the terminals 6 can be inserted into the terminal receiving sections $\mathbf{26}_2$ to push and split the led wires **4*a* by the terminal inserting guide 24. However, it is afraid that the led wire 4*a*** is bent too large to be deformed.

The terminals 6 can be inserted into the terminal receiving section $\mathbf{26}_1$ of number 2 shown in FIG. **5*a*, and turning the connector housing 14 and the terminals 6 upside down, the terminals 6 can be inserted into the terminal receiving section $\mathbf{26}_2$ of number 4 in the upper row shown in FIG. 5*b***.

Instead of the above embodiment, when the terminal inserting station 21 is near to the conveyer belt 1, that is, the tact time of transferring the wire by the conveyer belt 1 and the tact time of transferring the wire with terminals 4 from the conveyer belt 1 to the terminal inserting heads 30 are equal, the temporarily holding units 10 can be eliminated so as to pick up and feed the wire with terminals 4 from the conveyer belt 1 to the feeding chucks 12 directly. Or, the feeding chucks 12 can be further eliminated so as to feed the wire with terminals 4 from the conveyer belt 1 to the chuck units 13 of the terminal inserting heads 30 directly. When the wire with terminals 4 is fed directly to the terminal inserting heads 30 by the chucks 7, the chucks 7 are preferably designed movable horizontally and independently of each other similarly as the feeding chuck 12.

In the above embodiment, the pair of terminal inserting heads 30 is provided. The three terminal inserting heads 30 may be required to insert the three terminals of wire with both ends terminals and one terminal of a joint wire joined with the middle area in a lengthwise of the wire simultaneously into the connector housings 14. The wire with terminals and joint wire is held and transferred by the three holders 2 adjacent to each other on the conveyer belt 1. The wire with two joint wires has four terminals 6, and can be operated by the four terminal inserting heads 30. Numbers of the chucks 7, the temporarily holding units 10 and the feeding chucks 12 should be adjusted corresponding to the number of the terminals.

In the embodiment shown in FIGS. 5*a* and 5*b*, the pair of chuck arms 28 of the terminal inserting heads 30 is slid to each other for turning the terminal 6 upside down. Instead of that, the pair of chuck arms 8 of the chuck 7 or the pair of chuck arms 22 of the feeding chuck 12 can be slid to each other.

While, in the embodiment, an only typical example of the present invention is described, it is not limited thereto. Various change and modifications can be made with the scope of the present invention.

What is claimed is:

1. A manufacturing method for wire harness, by inserting a terminal into a connector housing which is supported at a connector supporting jig by using a terminal inserting device, comprising the steps of:

measuring and cutting a wire in a predetermined length;

joining a separate terminal to each end of the cut wire;

holding the each end of the wire with terminals at two holders adjacent each other;

transferring the two holders holding the each end of the wire with terminals in a transferring direction by a transferring device;

picking up the both ends of the wire at a predetermined position in the transferring direction from the transferring device by a pair of chucks, each said chuck picking up one of the both ends of the wire;

chucking the both ends of the wire with terminals fed through the pair of chucks, each end of the wire being fed through one of the pair of chucks, by a pair of terminal inserting heads as the terminal inserting device, the pair of terminal inserting heads moving freely independently of each other at least in a direction of a row of the connector housings; and inserting the terminals at the both ends simultaneously into each of the connector housings.

2. The manufacturing method according to claim 1, further comprising the steps of:

turning the connector housing supported at the connector supporting jig upside down; and turning the terminals upside down before inserting the terminals into each of the connector housings.

* * * * *